United States Patent [19]

Nagler et al.

[11] Patent Number: 5,210,755

[45] Date of Patent: May 11, 1993

[54] CIRCUIT ARRANGEMENT FOR CLOCK REGENERATION IN CLOCK-CONTROLLED INFORMATION PROCESSING SYSTEMS

[75] Inventors: Werner Nagler, Hohenschaeftlarn; Lothar Schmidt, Fuersteneldbruck, both of Fed. Rep. of Germany

[73] Assignee: Siemens Aktiengesellschaft, Munich, Fed. Rep. of Germany

[21] Appl. No.: 611,731

[22] Filed: Nov. 13, 1990

[30] Foreign Application Priority Data

Nov. 29, 1989 [DE] Fed. Rep. of Germany ....... 3939457

[51] Int. Cl.$^5$ .......................... H04J 3/06; H04L 7/02
[52] U.S. Cl. .................... 370/108; 375/118; 307/269; 331/172
[58] Field of Search .................. 370/108, 100, 16, 13; 331/172, 173; 375/118; 307/265, 266, 267, 268, 269

[56] References Cited

U.S. PATENT DOCUMENTS

| | | | |
|---|---|---|---|
| 3,808,368 | 4/1974 | Pitroda et al. | 370/108 |
| 4,488,292 | 12/1984 | Troost | 370/108 |
| 4,620,312 | 10/1986 | Yamashita | 307/265 |
| 5,059,818 | 10/1991 | Witt et al. | 307/269 |

FOREIGN PATENT DOCUMENTS

3227848C2 7/1987 Fed. Rep. of Germany.
3227849C2 8/1987 Fed. Rep. of Germany.

Primary Examiner—Wellington Chin
Attorney, Agent, or Firm—Hill, Steadman & Simpson

[57] ABSTRACT

Line terminal groups are redundantly present for reliability reasons. The connecting through of the input lines to the switching matrix network can thereby proceed via different signal paths. In order to avoid disturbances during switch-over between signal paths, the appertaining interfaces are provided with compensation memories. The data contained in the compensation memories are written in or read out in a phase-synchronized and frame-synchronized manner with a uniform clock. The uniform clock is acquired from the electronic switching device base clock of the system. Due to transient time distortions and component tolerances, the base clock must be regenerated with the circuit arrangement of the invention before it is applied to the compensation memories.

8 Claims, 2 Drawing Sheets

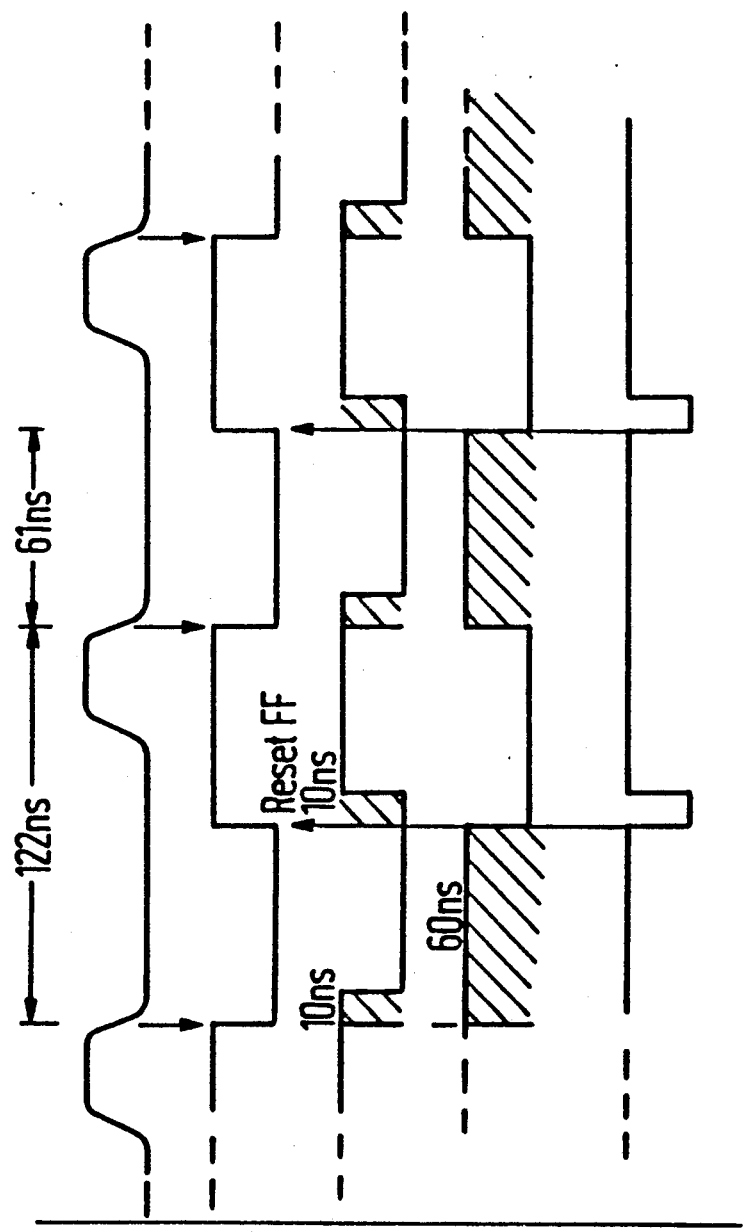

CIRCUIT ARRANGEMENT FOR CLOCK REGENERATION IN CLOCK-CONTROLLED INFORMATION PROCESSING SYSTEMS

BACKGROUND OF THE INVENTION

1. Field of the Invention:

The present invention relates to a circuit arrangement for clock regeneration in clock-controlled information processing systems and more specifically to generation of a clock from a distorted incoming clock.

2. Description of the Prior Art

The German patent applications 32 27 848 C2 and 32 27 849 C2 disclose circuit arrangements on the basis of voltage-controlled oscillators that can be employed for clock regeneration. However, in combination with clock-controlled switching systems, for example, problems very often arise that can no longer be governed with the known circuit arrangements. Offering transmission paths for an interruption-free message flow plays an overriding role in information processing systems. To this end, the message paths are redundantly designed in parallel. The realization of these parallel paths therefore occurs by doubling the equipment. The reliability lying in the redundancy can be realized in that a switch to the parallel path is respectively undertaken in case of malfunction. Such a malfunction is always established when the message flow or, respectively, the bit stream allocated thereto is deteriorated in some way or is even interrupted. This triggers a switching or rerouting, in particular onto the respective back-up route. An additional disturbance, however, can always arise when the synchronism between the two bit streams is not established. The synchronism can be deteriorated by distortions of the controlling clock, for example in frequency and/or phase.

The offering of a clock grid that has high-quality coincidence and is uniform in phase and frequency is required in order to eliminate distortion problems. Such a uniform clock grid having high-quality coincidence is acquired on the basis of a central clock (see the German patent 31 11 022), whereby, however, this central clock can be distorted due to transit time and/or component tolerances such that it no longer immediately satisfies the requirements made thereof and can therefore no longer be directly employed.

Circuit arrangements for clock regeneration are required for this reason. Clock regeneration devices constructed of voltage-controlled oscillators, as disclosed in the aforementioned patent applications, however, have the following disadvantages:

1. The synchronism vis-a-vis frequency and phase relation between the synchronizing clock and the regenerated clock with the aforementioned circuit arrangements constructed on the basis of voltage-controlled oscillators cannot be guaranteed, as practical experience has shown. The phase relationship required for the synchronization of signals with respect to frequency and phase relation is therefore not met; and
2. Due to the locking behavior of the feedback device, individual noise infeeds, for example infeeds in the form of spike pulses, can occur due to the influence of lightning of the subscriber line, and lead to longer-lasting deviations in frequency and phase relations and, accompanying this, lead to a falsification of the transmitted information.

SUMMARY OF THE INVENTION

It is therefore an object of the present invention to provide a clock regeneration circuit that 1. Guarantees a phase synchronism between the input and output signals; and
2. Avoids longer-lasting frequency deviations due to individual noise infeeds, for example in the form of spike pulses.

The above object is achieved, according to the present invention, in a clock-controlled information processing system which is characterized in that the clock to be regenerated is applied to the input of a flip-flop circuit, and in that a signal that is inverted relative to the output signal of the flip-flop circuit is fed back to the reset input of the flip-flop circuit via a delay device whose delay time is shorter than the clock period.

According to a particular feature of the invention, the inverse output signal is acquired by way of an inverter following the output of the flip-flop circuit.

According to another feature of the invention, the inverse output signal acquired via a second output fo the flip-flop circuit which is inverted relative to the first output of the flip-flop circuit.

According to another feature of the invention, the delay time corresponds to the desired pulse-duty factor of the clock to be regenerated.

According to another feature of the invention, the delay time of the delay device corresponds to half the period duration of the clock signal to be regenerated.

According to another feature of the invention, the delay device inserted into the feedback branch has two outputs corresponding to different delay times, the signals of the two outputs being fed to a logic circuit whose output is connected to the reset input of the flip-flop, and in that the shorter of the two delay times is dimensioned such that a reliable resetting of the flip-flop is guaranteed.

Advantageously, the circuit arrangement of the present invention, as set forth above, may be utilized in a clock-controlled telephone system, particularly a centrally-controlled telephone switching system, wherein redundant data paths are provided for reliability reasons and at whose ends compensation memories are provided for localized compensation of different transit times so that an alternate route for data transmission is always available in case of fault, and wherein a switch-over device is provided for a switching between the redundant data paths, and in which the system utilizes a clock grid that is uniform in phase and frequency and is applied to the compensation memories, the clock grid being regenerated at a central device, as mentioned above, based on the incoming clock which is distorted by transit time and component tolerances.

According to another feature of the invention, the circuit arrangement is characterized in that the regenerated clock signal is not only applied to the compensation memories, but is also applied to a synchronization device preceding the compensation memories and with whose assistance signals incoming from a switching matrix network are brought into chronological superposition with the regenerated clock signal.

According to another feature of the invention, the circuit arrangement is characterized in that, upon utilization of a regenerated clock grid which is uniform in phase and frequency, the message channel provided for the transmission of the signaling information is connected through in the direction toward a switching matrix network of the system independently of the selected data route.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 2 is a timing diagram as an aid to explaining the invention.

DESCRIPTION OF THE PREFERRED EMBODIMENT

Figure 1:
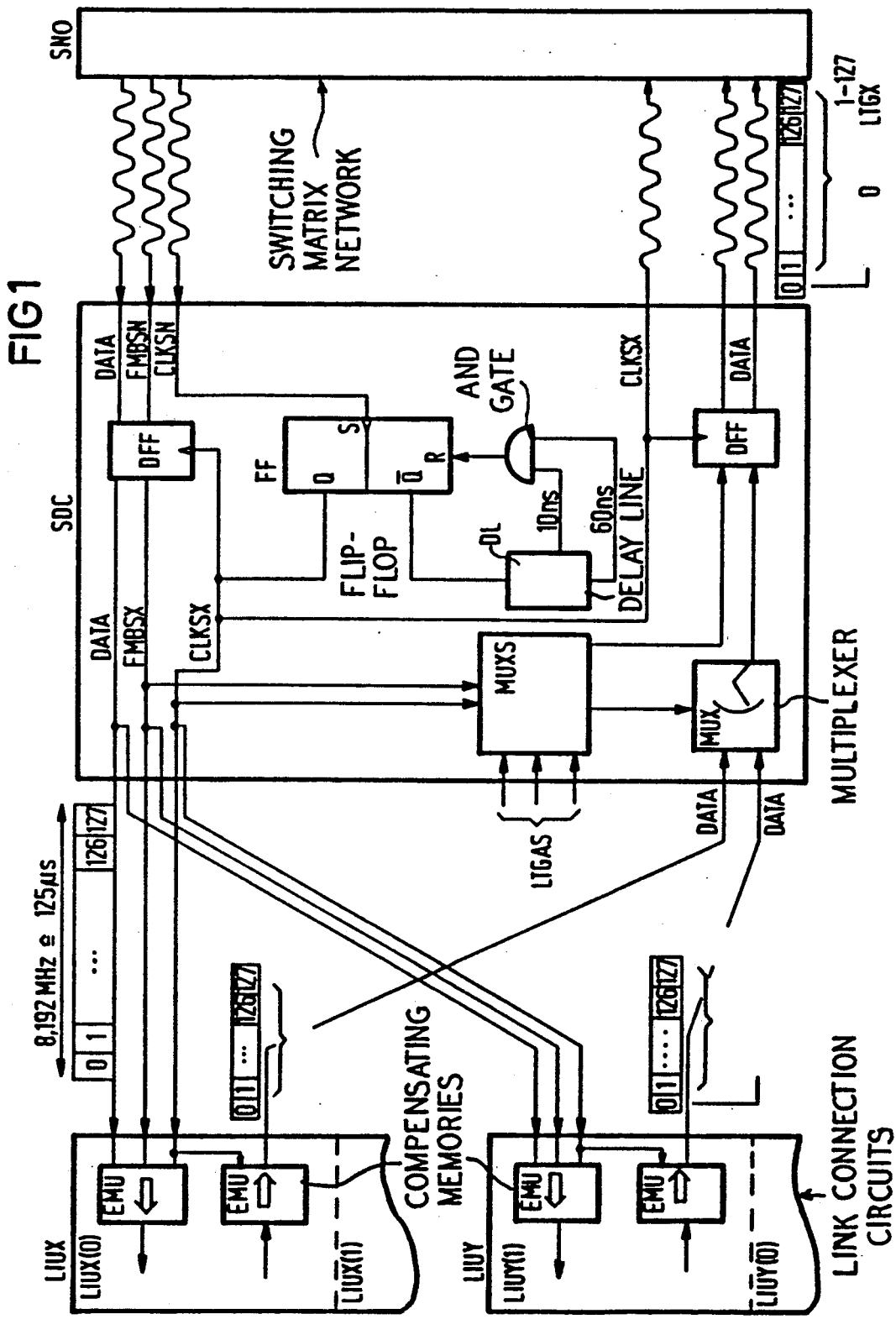
FIG. 1 is a schematic representation of a portion of a telephone system employing a circuit arrangement constructed in accordance with the present invention.

Referring to FIG. 1, the same is based on an illustration and description of a pulse code modulation (PCM) telephone switching system as disclosed, for example, in the European patent application 0 236 779. The description of the exemplary embodiment of the invention therefore proceeds therefrom such that a centrally-controlled PCM telephone switching system of the type shown and disclosed in the aforementioned European patent application is known. In addition, the German patent application P 38 32 242.0 discloses a switching system having line groups allocated to one another in pairs ("redundant") that are connected to a redundant switching matrix network. The significance of a uniform clock grid for the function of the system is also described therein.

The exemplary embodiment of the invention illustrated in FIG. 1 is based on the illustration and description of the connection of the line terminal groups LTGX (LTGX(0), LTGX (1)) and LTGY, (LTGY (0), LTGY (1)) respectively individually assigned to one another in pairs to the redundant switching matrix network SN (SN0, SN1) and therefore represents a portion of the exemplary embodiment shown in the above-mentioned German patent application P 38 32 242.0. The description of such a system has been foregone herein in that the same is considered well-known in the art.

The apparatus illustrated in FIG. 1 includes a switching matrix network SN, a clock regulating assembly, and two link connection circuits LIUX and LIUY. The latter contain compensating memories EMU. Numerous embodiments of such compensating memories are known from the above-mentioned art. They are always to be provided wherever pulse sequences are to be accepted whose clock is to be brought into agreement with the clock that is respectively determined within the appertaining package.

A synchronization is provided with respect to frequency and phase of the pulses to be transmitted, i.e. of the pulses to be respectively accepted in the pulse sequence to be accepted.

As already mentioned above, much of the equipment are redundant in information processing systems for reasons of reliability. In FIG. 1, these equipment, for example, are the link connection circuits LIUX and LIUY. They represent the interfaces to the line terminal groups LTG as disclosed in the German patent application P 38 32 242.0 that are not set forth in greater detail in the above-mentioned example. Two entirely identical paths are therefore available for the information data that are referenced "DATA" in FIG. 1. As was likewise already mentioned above, the switching or, respectively, rerouting onto the respective alternate route occurs in case of malfunction. The two routes again come together at what is referred to as a transfer point to form one route that proceeds to the switching matrix network SN. Such a transfer point is realized by a multiplexer MUX in the above-cited example. In addition to its known multiplexer function, its job in the content established here is comprised of:

1) alternating reception of the bit stream 1 or the bit stream 2 and the respective transmission in the direction of the switching matrix network SN;
2) seeing to it that only the message channel that carries the signaling information, that is only the link connection circuit LIUX in the above-cited example of the message channel $\phi$, is interconnected with the voice channels 1-127 of the link connection circuits LIUX or LIUY and the frame resulting therefrom is transmitted in the direction toward the switching matrix network SN. During normal operation, this means that the multiplexer forwards the message channel $\phi$ of the link connection circuit LIUX that carries the signaling information in the direction toward the switching matrix network SN as a complete frame together with the voice channels 1-127 of the link connection circuit LIUX; and
3) in the switch-over mode, by contrast, the multiplexer MUX interconnects the message channel $\phi$ of the link connection circuit LIUX that carries the signaling information with the voice channels of the link connection circuit LIUY and forwards the frame that has arisen as a result thereof in the direction toward the switching matrix network.

This object, however, can only be successfully achieved when the information data "DATA" of both paths are brought into chronological superposition in a clock-synchronized, phase-synchronized and frame-synchronized manner at the end points of both paths that are represented by the compensation memories EMU, i.e. at the input of the multiplexer MUX. This occurs by reading the information data "DATA" out from each of the two compensation memories with the same clock and the same frame identifier. These information data therefore proceed from the two compensation memories EMU to the multiplexer MUX and the latter employs the information data and the signaling data in the manner already set forth.

There is therefore the necessity to bring the pulses sequences for clock data, frame identifier data and information data into chronological superposition and to forward the same to both of the compensation memories EMU. The system clock CLKSN coming from the switching matrix network is employed as a base clock.

FIG. 1 illustrates the signals DATA, FMBSN, CLKSN incoming from the switching matrix network SN0. Due to the long route lead (up to 250 m), as well as due to component tolerances, these signals are distorted and must be regenerated in frequency, level and phase. In particular, the clock, phase and frame coincidence is particularly lacking in view of the relative phase relationship of the three signals; these must be restored. The object is achieved, according to the present invention, among other things, in that the clock sequence CLKSN is transmitted to the setting input S of a flip-flop FF. The signal $\bar{Q}$ of the output side of the flip-flop FF that is acquired via a second output which is inverted relative to the first output Q, whereby an alternative solution may be provided by an inverter following the output Q, is forwarded onto a delay module (delay line DL). The delay line has two outputs, in particular a delay time of 10 ns and a delay time of 60 ns. The two output signals of the delay module (delay line DL) identified with these delay times are connected to respective inputs of and AND gate that, in turn, has its output connected to the reset input R of the flip-flop FF. The delay time of 10 ns serves the purpose of assuring a stable application of the reset signal at the reset input R and, therefore, of guaranteeing a reliable resetting of the flip-flop FF.

The above-described circuit arrangement constructed in accordance with the present invention therefore restores the uniformity in frequency and phase and also eliminates the risk that individual noise infeeds in the form of spikes lead to longer-lasting frequency deviations. These advantages cannot be achieved with the methods set forth with respect to the above-mentioned art because:

1) practical experience has shown that a fixed phase relationship between an output signal and an input signal cannot be guaranteed; and
2) noise infeeds in the form of spikes inevitably lead to frequency deviations due to the locking behavior of the feedback device.

These two situations are, in fact, unproblematical in many fields of applied technology; wherever, however, recourse must be had to a uniform clock grid having the properties as set forth above, a clock regeneration with the circuit arrangement constructed in accordance with the present invention has heretofore unachievable advantages. Avoiding information losses in switching events has therefore now been successfully achieved.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A circuit arrangement for clock regeneration in a clock-controlled information-processing system comprising:
    a flip-flop including a set input connected to receive an incoming clock to be regenerated and having a predetermined clock period, a reset input, and output means including a first output for providing a first output signal and a second output for providing a second output signal which is inverted with respect to said first output signal; and
    delay means connected between said output means and said reset input of said flip-flop and having a delay time which is shorter than said predetermined clock period.

2. The circuit arrangement of claim 1, wherein:
    said second output is connected to said delay means for supplying said inverted second output signal thereto.

3. The circuit arrangement of claim 1, wherein:
    an inverter is connected between said first output and said delay means for providing said first output signal to said delay means.

4. The circuit arrangement of claim 1, wherein said delay means comprises:
    a delay line having a delay time equal to a desired pulse duty factor of the clock to be regenerated.

5. The circuit arrangement of claim 1, wherein said delay means comprises:
    a delay line having a delay time corresponding to half the period of the clock to be regenerated.

6. The circuit arrangement of claim 1, wherein said delay means comprises:
    a delay line including an input and first and second outputs and operable to provide a first delay time effective at said first output and a second delay time which is shorter than said first delay time and effective at said second output to provide a reliable resetting of said flip-flop; and
    an AND gate including first and second inputs respectively connected to said first and second outputs of said delay line, and an output connected to said reset input of said flip-flop.

7. In a clock-controlled telephone system, particularly a centrally-controlled telephone switching system.
    a switching matrix network providing an incoming clock;
    redundant data paths coupled to said switching matrix network and including respective ends, and clock-controlled compensation memories connected at said second ends of said redundant data paths for local compensation of transient times, so that an alternate route for data transmission is available in case of fault;
    a clock-controlled switch-over device for switching between said redundant data path; and
    a clock generator connected to provide said memories and said switch-over device with a clock grid of uniform phase and frequency from the incoming clock which is distorted due to transient time and component tolerances, said clock generator comprising
        a flip-flop including a set input connected to receive said incoming clock which is to be regenerated, a reset input, and output means including a first output for providing a first output signal and a second output for providing a second output signal which is inverted with respect to said first output signal, and
    delay means connected between said output means and said reset input of said flip-flop and having a delay time which is shorter than the period of the incoming clock.

8. The clock-controlled telephone switching system of claim 7, and further comprising:
    a message channel in each of said data paths for the transmission of signaling information toward said switching matrix network independently of the selected data route.

* * * * *